United States Patent
Lee

(10) Patent No.: US 8,039,907 B2
(45) Date of Patent: Oct. 18, 2011

(54) SEMICONDUCTOR DEVICE AND METHOD FOR FABRICATING THE SAME

(75) Inventor: In-Chan Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 679 days.

(21) Appl. No.: 12/005,464

(22) Filed: Dec. 26, 2007

(65) Prior Publication Data

US 2008/0237722 A1   Oct. 2, 2008

(30) Foreign Application Priority Data

Mar. 30, 2007   (KR) .............................. 2007-0031720

(51) Int. Cl.
*H01L 29/772* (2006.01)
(52) U.S. Cl. ........ 257/412; 257/374; 257/401; 257/413; 257/E29.128; 257/E29.134; 257/E29.156
(58) Field of Classification Search .................... 257/366
See application file for complete search history.

(56) References Cited

U.S. PATENT DOCUMENTS

| 6,548,862 B2* | 4/2003 | Ryu et al. ....................... 257/331 |
| 2001/0041250 A1* | 11/2001 | Werkhoven et al. .......... 428/212 |
| 2002/0019107 A1* | 2/2002 | Lin et al. ....................... 438/396 |
| 2003/0042568 A1* | 3/2003 | Jang .............................. 257/510 |
| 2004/0183125 A1* | 9/2004 | Hofmann et al. ............. 257/316 |
| 2004/0188753 A1* | 9/2004 | Kawashima et al. .......... 257/316 |

FOREIGN PATENT DOCUMENTS

| KR | 10-1998-0067670 A | 10/1998 |
| KR | 10-2006-0110985 A | 10/2005 |

* cited by examiner

*Primary Examiner* — Davienne Monbleau
*Assistant Examiner* — Fei Fei Yeung Lopez
(74) *Attorney, Agent, or Firm* — Blakely Sokoloff Taylor & Zafman

(57) ABSTRACT

A transistor, comprising a first gate structure formed on a substrate, and having a stacked structure of a first gate electrode and a first gate hard mask, a first gate spacer formed on sidewalls of the first gate structure, a second gate structure having a stacked structure of a second gate electrode and a second gate hard mask, the second gate structure surrounding both sidewalls and top surfaces of the first gate structure and the first gate spacer, and a second gate spacer formed on sidewalls of the second gate structure.

19 Claims, 5 Drawing Sheets

SEMICONDUCTOR DEVICE AND METHOD FOR FABRICATING THE SAME

CROSS-REFERENCE TO RELATED APPLICATIONS

The present invention claims priority of Korean patent application number 10-2007-0031720, filed on Mar. 30, 2007, which is incorporated by reference in its entirety.

BACKGROUND OF THE INVENTION

The present invention relates to fabricating a semiconductor device, and more particularly, to a transistor in a semiconductor device and a method for fabricating the same.

A typical transistor in a semiconductor device may have a single gate structure having a gate crossing an active region of a substrate. The single gate structure provides such an advantage that it is possible to reduce a transistor forming area, but it is difficult to satisfy both of characteristics of leakage current and turn-on current in the transistor at the same time since there is a trade-off relation between the leakage current characteristics and the turn-on current characteristics in the transistor. Hence, it is difficult to form a high-speed transistor with low power consumption.

To satisfy both of the leakage current characteristics and the turn-on current characteristics, a transistor having a double gate structure (hereinafter, referred to as a double gate transistor for simplicity) has been suggested, which is capable of reducing the leakage current characteristics while maintaining the turn-on characteristics of the transistor.

FIGS. 1A to 1C illustrate a typical double gate transistor. Specifically, FIG. 1A illustrates a layout view of the typical double gate transistor, FIG. 1B illustrates a cross-sectional view taken along line I-I' of FIG. 1A, and FIG. 1C illustrates an equivalent circuit diagram of FIG. 1A.

Referring to FIGS. 1A to 1C, an active region A is defined by an isolation layer 103 formed in an isolation region F of a substrate 101. Over the active region A of the substrate 101, two gate structures, i.e., first and second gate structures 105 and 107, cross the active region A, and are spaced apart from each other by a predetermined distance. Such a structure where two gates are formed over the active region is called a double gate structure.

Source/drain junction regions (not shown) are provided in the substrate 101 at both sides of the first and second gate structures 105 and 107. Referring to FIG. 1A, the source/drain junction regions are connected to a bit line or a storage electrode through source/drain contacts C which are spaced apart from each other by a predetermined interval. Such a double gate transistor may provide an advantage of improvement in leakage current characteristics since it has one more gate compared to a single gate transistor. The double gate transistor, however, cannot meet an ongoing demand for high-integration of semiconductor devices because the transistor requires a large forming area.

SUMMARY OF THE INVENTION

The present invention is directed to provide a transistor in a semiconductor device with high-speed performance, which can reduce a transistor forming area and a leakage current by implementing a transistor having a double gate structure having first and second gate structures where the second gate structure surrounds the first gate structure, and a method for fabricating the transistor.

In accordance with an aspect of the present invention, there is provided a transistor, the transistor comprising: a first gate structure formed on a substrate, and having a stacked structure of a first gate electrode and a first gate hard mask; a first gate spacer formed on sidewalls of the first gate structure; a second gate structure having a stacked structure of a second gate electrode and a second gate hard mask, the second gate structure surrounding both sidewalls and top surfaces of the first gate structure and the first gate spacer; and a second gate spacer formed on sidewalls of the second gate structure.

In accordance with another aspect of the present invention, there is provide a method for fabricating a transistor, the method comprising: forming a first insulation layer on a substrate; forming a first gate structure over the first insulation layer, the first gate structure having a stacked structure of a first gate electrode and a first gate hard mask; forming a first gate spacer on sidewalls of the first gate structure; forming a second insulation layer over a resultant structure including the first gate structure and the first gate spacer; forming a second gate structure over the second insulation layer, the second gate structure having a stacked structure of a second gate electrode and a second gate hard mask and surrounding both of sidewalls and top surfaces of the first gate structure and the first gate spacer; and forming a second gate spacer on sidewalls of the second gate structure.

In accordance with a further aspect of the present invention, there is provide a layout structure of a transistor, comprising: a first gate crossing an active region; a second gate overlapping the first gate, and having a greater width than the first gate; and source/drain contacts formed at both sides of the first and second gates.

DESCRIPTION OF SPECIFIC EMBODIMENTS

Figure 1A:
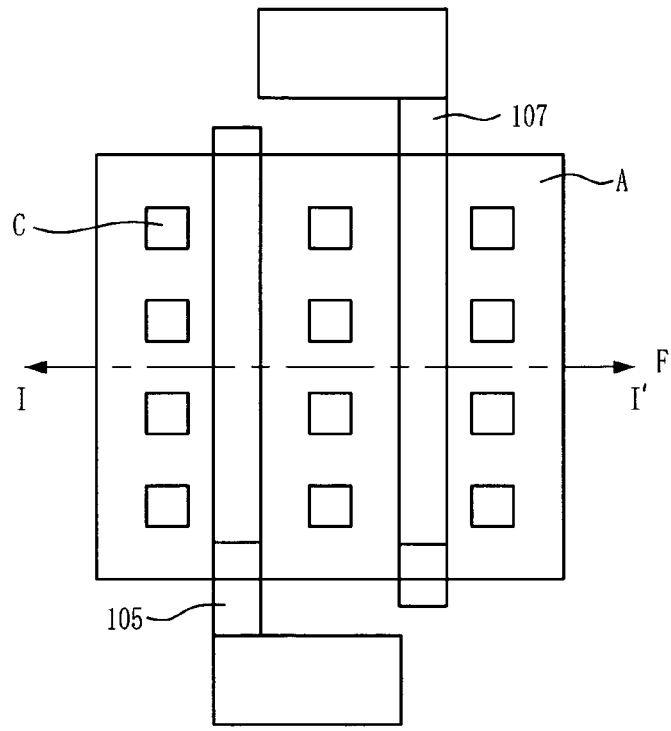
FIGS. 1A to 1C illustrate a typical double gate transistor.
Figure 1B:
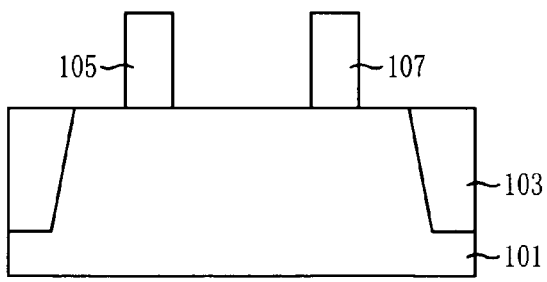
Figure 1C:
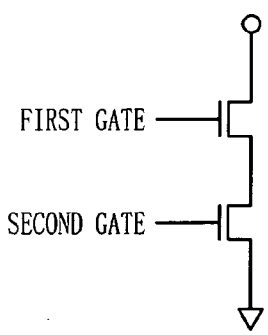
Figure 2A:
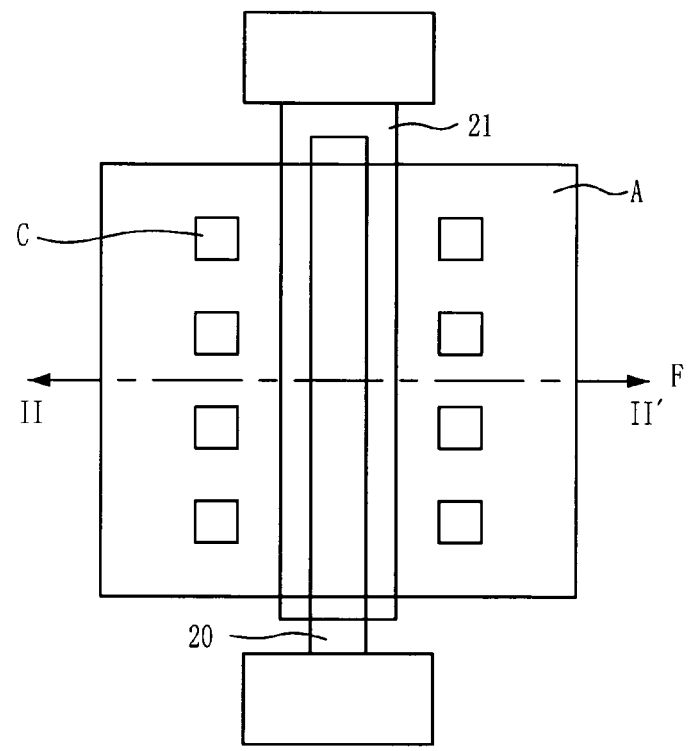
FIGS. 2A and 2B illustrate a transistor in accordance with an embodiment of the present invention.
Figure 2B:
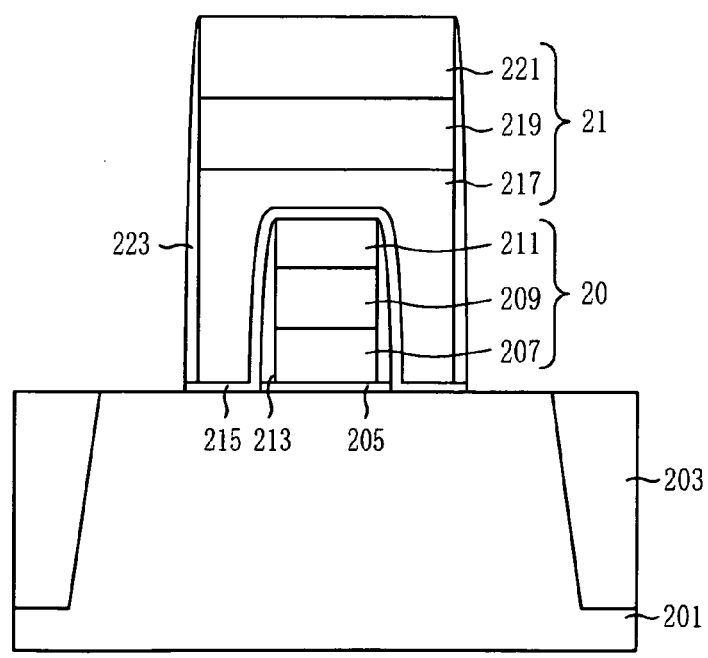

FIGS. 2A and 2B illustrate a transistor in a semiconductor device in accordance with an embodiment of the present invention. FIG. 2A illustrates a layout view of the transistor in accordance with the embodiment of the present invention, FIG. 2B illustrates a cross-sectional view taken along line II-II' of FIG. 2A.

Referring to FIGS. 2A and 2B, an active region A is defined by an isolation layer 203 provided in an isolation region F of a substrate 201. Over the active region A of the substrate 201, two gate structures, i.e., first and second gate structures 20 and 21, cross the active region A and form a stacked structure. The second gate structure 21 is formed over the first gate structure 20 such that it surrounds both sidewalls and a top surface of the first gate structure 20. Thus, the second gate structure 21 should have a greater width than the first gate structure 20.

Herein, the first gate structure 20 is insulated from the substrate 201 by a first insulation layer 205. The first gate structure 20 has a stacked structure provided with a first polysilicon layer 207, a first tungsten silicide layer 209, and a first nitride layer 211 for a gate hard mask. Herein, the first polysilicon layer 207 and the first tungsten silicide layer 209 are provided for a gate electrode. A first gate spacer 213 is formed on sidewalls of the first gate structure 20. For example, the first gate spacer 213 may be formed of nitride. The first nitride layer 211 and the first gate spacer 213 are used as an isolation layer for isolating the first gate structure 20 from the second gate structure 21. It is preferable that the first nitride layer 211 is formed to a thickness of approximately 10 nm and the first gate spacer 213 is formed to a thickness of approximately 5 nm.

The second gate structure 21 is insulated from the substrate 201 by a second insulation layer 215. Moreover, the second gate structure 21 has a stacked structure provided with a second polysilicon layer 217, a second tungsten silicide layer 219, and a second nitride layer 221 for a gate hard mask. The second polysilicon layer 217 and the second tungsten silicide layer 219 are provided for a gate electrode. A second gate spacer 223 is formed on sidewalls of the second gate structure 21. For example, the second gate spacer 223 may be formed of nitride. As described above, the second gate structure 21 should have a greater width than that of the first gate structure 20 in order that the second gate structure 21 may surround both sidewalls and the top surface of the first gate structure 20. Further, it is preferable that the lowermost layer of the second gate structure 21, i.e., the second polysilicon layer 217, is at least as high as the first gate structure 20.

Lightly-doped drain (LDD) ion implantation regions (not shown) are provided in the substrate 201 at both sides of the first gate structure 20, and source/drain junction regions (not shown) are provided in the substrate 201 at both sides of the second gate structure 21. Referring to FIG. 2A, the source/drain junction regions are connected to a bit line or a storage electrode through source/drain contacts C which are spaced apart from each other by a predetermined distance. The double gate transistor having a stacked structure can reduce the transistor forming area compared to the typical double gate structure, thus satisfying demands for high-integration of a semiconductor device. Furthermore, in accordance with the double gate transistor of the present invention, leakage current can be reduced because the two gates are turned off in a stand-by mode. Thus, it is possible to achieve high-speed performance since one of the two gates is always turned on in an active mode.

FIGS. 3A to 3D illustrate a method for fabricating a transistor in a semiconductor device in accordance with an embodiment of the present invention.

Figure 3A:
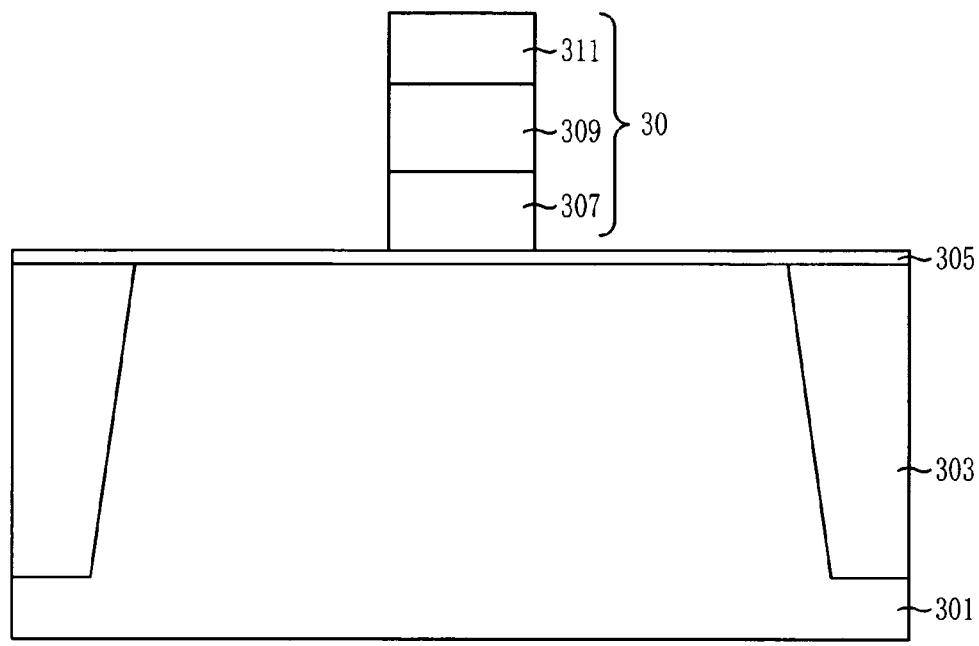
FIGS. 3A to 3D illustrate a method for fabricating a transistor in accordance with an embodiment of the present invention.

Referring to FIG. 3A, an isolation layer 303 is formed for isolating devices from each other in an isolation region to define an active region. An ion implantation is then performed on the active region so as to form a well region (not shown).

A first insulation layer 305 is formed on a substrate 301 having an isolation layer 303. A conductive layer for a gate electrode, i.e., a first polysilicon layer (not shown) and a first tungsten silicide layer (not shown), and an insulation layer for a gate hard mask, i.e., a first nitride layer (not shown), are sequentially formed on the first insulation layer 305. The first nitride layer is used as an isolation layer for isolating a first gate structure 30 from a subsequent second gate structure. It is preferable that the first nitride layer is formed to a thickness of approximately 10 nm.

A photo resist pattern (not shown) is formed on the first nitride layer, and thereafter the first nitride layer, the first tungsten silicide layer, the first polysilicon layer and the first insulation layer 305 are sequentially etched using the photo resist pattern as an etch mask to thereby form the first gate structure 30 of a first nitride layer 311, a first tungsten silicide layer 309, and a first polysilicon layer 307. A lightly doped drain (LDD) ion implantation is performed on a first resultant structure with the first gate structure 30, thus forming LDD ion implantation regions (not shown) in the substrate 301 at both sides of the first gate structure 30.

Figure 3B:
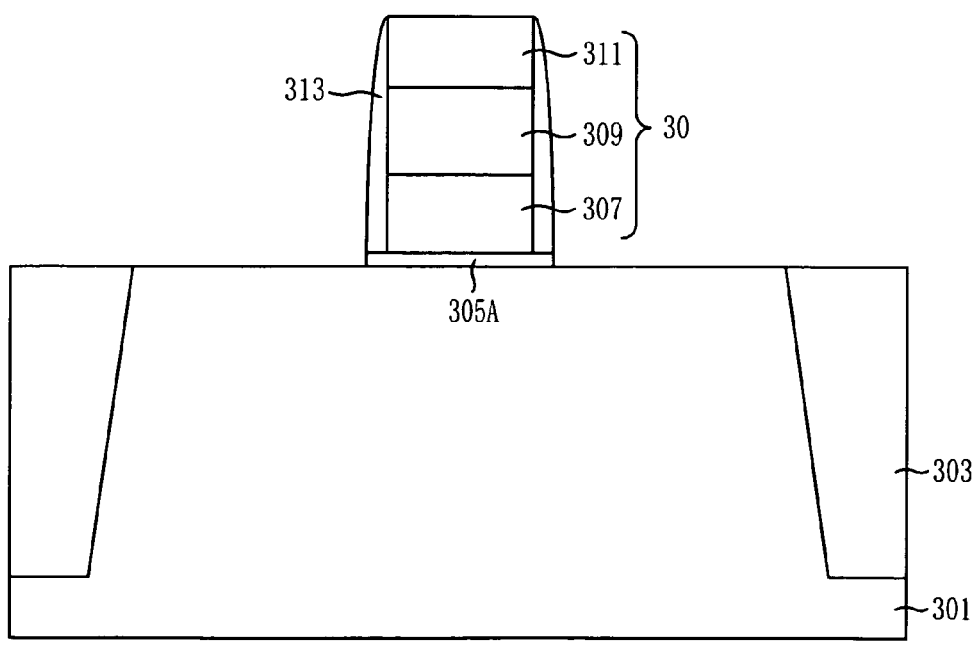
Figure 3C:
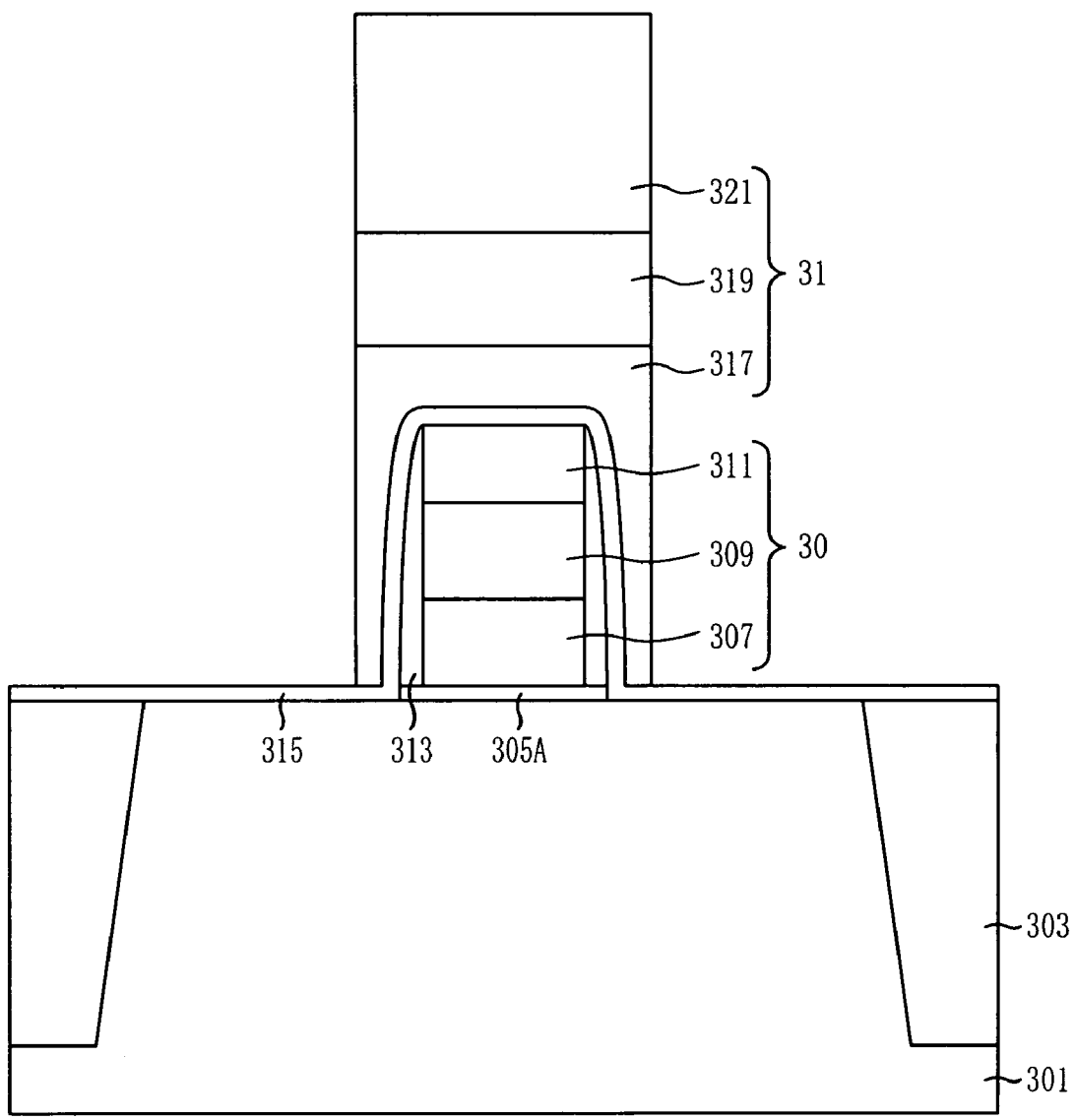

Referring to FIG. 3B, a nitride layer (not shown) for a gate spacer is formed to a thickness of approximately 5 nm over the first resultant structure including the first gate structure 30. A blanket etching process is performed to leave the nitride layer on sidewalls of the first gate structure 30. The nitride layers remaining on the sidewalls of the first gate structure 30 are hereinafter referred to as first gate spacers 313 which used as isolation layers for isolating the first gate structure 30 from a second gate structure (FIG. 3C). A reference numeral 305A represents the first insulation layer after the blanket etching process.

Referring to FIG. 3C, a second insulation layer 315 is formed on a second resultant structure including the first gate structure 30 and the first gate spacers 313. A conductive layer for a gate electrode, i.e., a second polysilicon layer (not shown), a second tungsten silicide layer (not shown), and an insulation layer for a gate hard mask, i.e., a first nitride layer (not shown), are sequentially formed on the second insulation layer 315.

A photo resist pattern (not shown) is formed on the second nitride layer, and thereafter the second nitride layer, the second tungsten silicide layer and the second polysilicon layer and the second insulation layer 315 are sequentially etched by using the photo resist pattern as an etch mask to thereby form a second gate structure 31 configured with a second nitride layer 321, a second tungsten silicide layer 319, and a second polysilicon layer 317. The photo resist pattern used to form the second gate structure 31 has a greater width than the photo resist pattern used to form the first gate structure 30, and the photo resist pattern used to form the second gate structure 31 is positioned such that it overlaps the photo resist pattern used to form the first gate structure 30. Thus, the second gate structure 31 surrounds both the sidewalls and the top surface of the first gate structure 30.

Figure 3D:
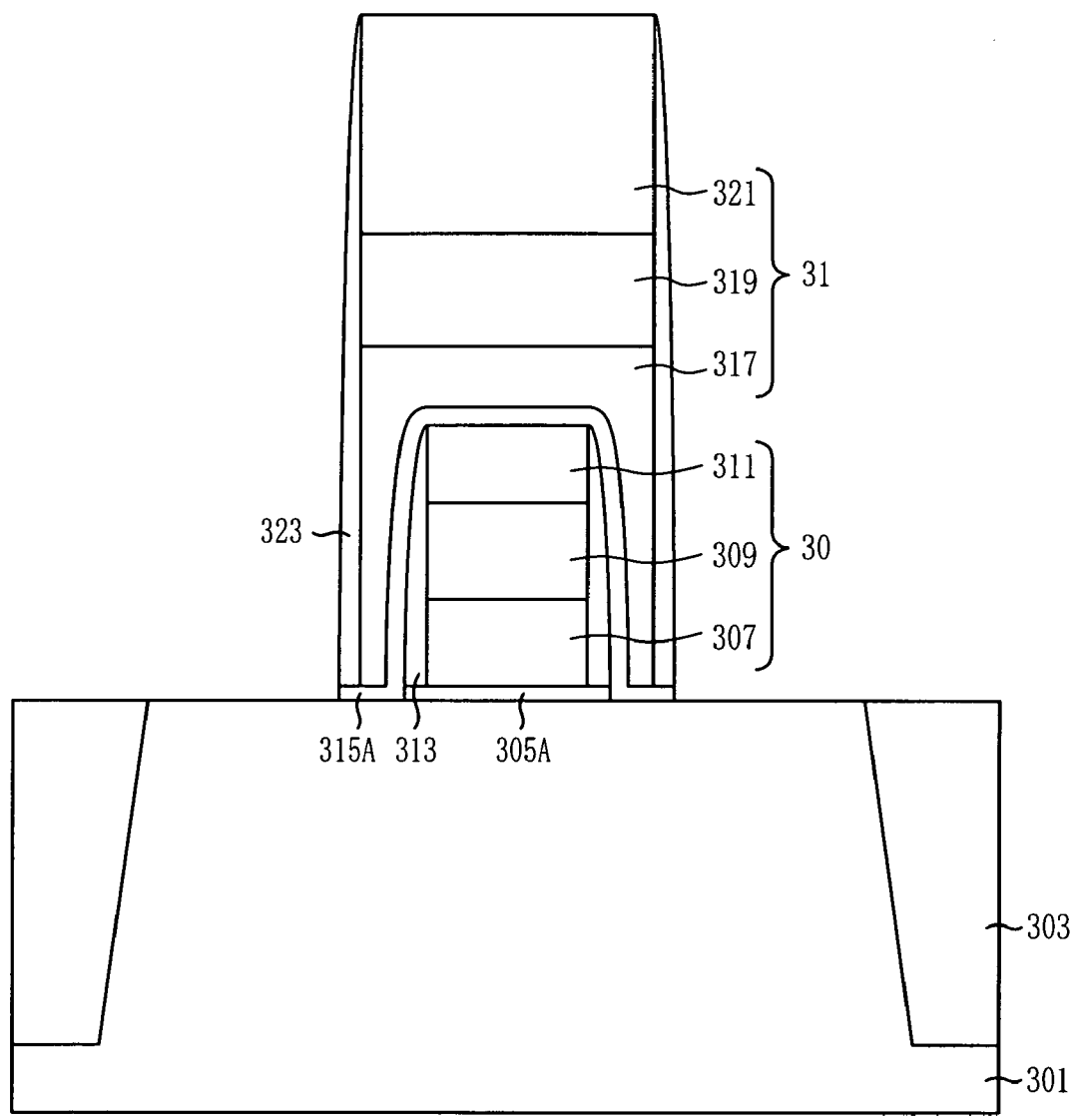

Referring to FIG. 3D, a source/drain ion implantation is performed on a third resultant structure with the second gate structure 31 formed, thus forming source/drain regions (not shown) in the substrate 301 at both sides of the second gate structure 31.

A nitride layer (not shown) for a gate spacer is formed over the third resultant structure including the second gate structure 31. A blanket etching process is performed to leave the nitride layer on sidewalls of the second gate structure 31. As such, the nitride layers remaining on the sidewalls of the second gate structure 30 are hereinafter referred to as second gate spacers 323. A reference numeral 315A represents the second insulation layer after the blanket etching process.

The double gate transistor manufactured through the above-described processes provides advantageous merits that the leakage current characteristics of the transistor can be improved and a forming area for the transistor can be reduced as well since one gate surrounds another gate there under. In particular, the double gate transistor of the present invention can perform at high operating speed as one of the two gates is always turned on in an active mode.

In a transistor of a semiconductor device and a method for fabricating the same in accordance with the present invention, it is possible to provide a double gate transistor in which a second gate structure surrounds a first gate structure, which makes it possible to reduce a transistor forming area and a leakage current and to achieve high-speed performance as well.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A transistor, comprising: a first gate structure formed on a substrate, and having a stacked structure of a first gate electrode and a first gate hard mask; a first gate spacer formed on a first vertical sidewall on a left hand side of the first gate structure and a second gate spacer formed on a second vertical sidewall on a right hand side of the first gate structure; a second gate structure having a stacked structure of a second gate electrode and a second gate hard mask, the second gate structure surrounding the first and the second vertical sidewalls of the first gate structure, sidewalls of the first and second gate spacers, and top surfaces of the first gate structure and the first gate spacer; and a third gate spacer formed on the sidewalls of the second gate structure including the second gate electrode and the second gate hard mask.

2. The transistor of claim 1, wherein the first gate electrode has a stacked structure of a polysilicon layer and a tungsten silicide layer.

3. The transistor of claim 1, wherein the first gate hard mask and the first gate spacer include nitride.

4. The transistor of claim 1, wherein the first gate hard mask has a thickness of approximately 10 nm, and the first gate spacer has a thickness of approximately 5 nm.

5. The transistor of claim 1, wherein the second gate electrode has a stacked structure of a polysilicon layer and a tungsten silicide layer.

6. The transistor of claim 5, wherein the second gate structure has a greater width than that of the first gate structure, and the polysilicon layer of the second gate electrode is higher than the first gate structure.

7. The transistor of claim 1, wherein the second gate hard mask and the second gate spacer are formed of nitride.

8. The transistor of claim 1, further comprising:
a first insulation layer formed under the first gate structure; and
a second insulation layer formed under the second gate structure.

9. The transistor of claim 1, further comprising:
lightly-doped drain (LDD) ion implantation regions provided in the substrate at both sides of the first gate structure; and
source/drain regions provided in the substrate at both sides of the second gate structure.

10. A method for fabricating a transistor, the method comprising: forming a first gate structure over a first insulation layer, the first gate structure having a stacked structure of a first gate electrode and a first gate hard mask; forming a first gate spacer formed on a first vertical sidewall on a left hand side of the first gate structure and a second gate spacer formed on a second vertical sidewall on a right hand side of the first gate structure; forming a second gate structure over a second insulation layer, the second gate structure having a stacked structure of a second gate electrode and a second gate hard mask and surrounding the first and the second vertical sidewalls of the first gate structure, sidewalls of the first and second gate spacers, and top surfaces of the first gate structure and the first gate spacer; and forming a third gate spacer on sidewalls of the second gate structure.

11. The method of claim 10, wherein the first gate electrode has a stacked structure of a polysilicon layer and a tungsten silicide layer.

12. The method of claim 10, wherein the first gate hard mask and the first gate spacer include nitride.

13. The method of claim 12, wherein the first gate hard mask is formed to a thickness of approximately 10 nm, and the first gate spacer is formed to a thickness of approximately 5 nm.

14. The method of claim 10, wherein the second gate electrode has a stacked structure of a polysilicon layer and a tungsten silicide layer.

15. The method of claim 14, wherein the second gate structure has a greater width than that of the first gate structure, and the polysilicon layer of the second gate electrode is higher than the first gate structure.

16. The method of claim 10, wherein the second gate hard mask and the second gate spacer are formed of nitride.

17. The method of claim 10, further comprising;
performing an LDD ion implantation to form LDD ion implantation regions in the substrate at both sides of the first gate structure, after forming of the first gate structure; and
performing a source/drain ion implantation to form source/drain junction regions in the substrate at both sides of the second gate structure, after forming of the second gate structure.

18. A layout structure of a transistor, comprising: a first gate crossing an active region, the first gate including a stacked structure of a first gate electrode, a first gate hard mask, a first gate spacer formed on a vertical sidewall on one side of the stacked structure, and a second gate spacer formed on a vertical sidewall on another side of the stacked structure; a second gate surrounding vertical sidewalls of the first and the second gate spacers and surrounding top surfaces of the first gate including the first gate electrode, the first gate hard mask, the first gate spacer, and the second gate spacer, the second gate including a stacked structure of a second gate electrode and a second hard mask; a third gate spacer formed on each of two vertical sidewalls of the stacked structure of the second gate; and source/drain contacts formed at both sides of the first and second gates.

19. The method of claim 10, further comprising:
forming a first insulation layer on a substrate before forming the first gate structure; and
forming a second insulation layer over a resultant structure including the first gate structure and the first gate spacer before forming the second gate structure.

* * * * *